United States Patent [19]

Wand

[11] Patent Number: 4,558,304
[45] Date of Patent: Dec. 10, 1985

[54] INCREMENTAL ENCODER SYNCHRONOUS DECODE CIRCUIT

[75] Inventor: Martin A. Wand, Garland, Tex.

[73] Assignee: Texas Instruments Incorporated, Dallas, Tex.

[21] Appl. No.: 469,186

[22] Filed: Feb. 24, 1983

[51] Int. Cl.$^4$ ............................................. H03K 13/02
[52] U.S. Cl. ................................ 340/347 SY; 318/661
[58] Field of Search ................. 340/347 SY; 318/660, 318/661, 662

[56] References Cited

U.S. PATENT DOCUMENTS

| | | | |
|---|---|---|---|
| 4,079,235 | 3/1978 | Froyd et al. | 318/571 |
| 4,282,468 | 8/1981 | Barker et al. | 318/661 |
| 4,358,723 | 11/1982 | Scholl et al. | 340/347 SY |
| 4,390,865 | 6/1983 | Lauro | 340/347 SY |
| 4,490,661 | 12/1984 | Brown et al. | 318/661 |

Primary Examiner—David Smith, Jr.
Attorney, Agent, or Firm—Alva H. Bandy; Leo N. Heiting; Melvin Sharp

[57] ABSTRACT

A synchronous decode circuit for an incremental encoder is disclosed which comprises analog-to-digital converters for converting in phase and quadrature encoder signals to transistor-to-transistor logic (TTL) compatible signals, a latch for receiving current logic level signals and the previous logic level signals for a gray code, a programmable read only memory (PROM) for decoding the logic level signals and generating clock and direction enable signals, and gating logic connected to the PROM for gating clock and direction signals to counters of the system, the counters are connected to a latch under control of the computer to latch the count of movement in preselected directions for the computer. In another embodiment the PROM includes scaling jumper means or error detection means or both for, respectively, adjusting the range of measurement (scale factor) and indicating error in the logic level signals.

4 Claims, 18 Drawing Figures

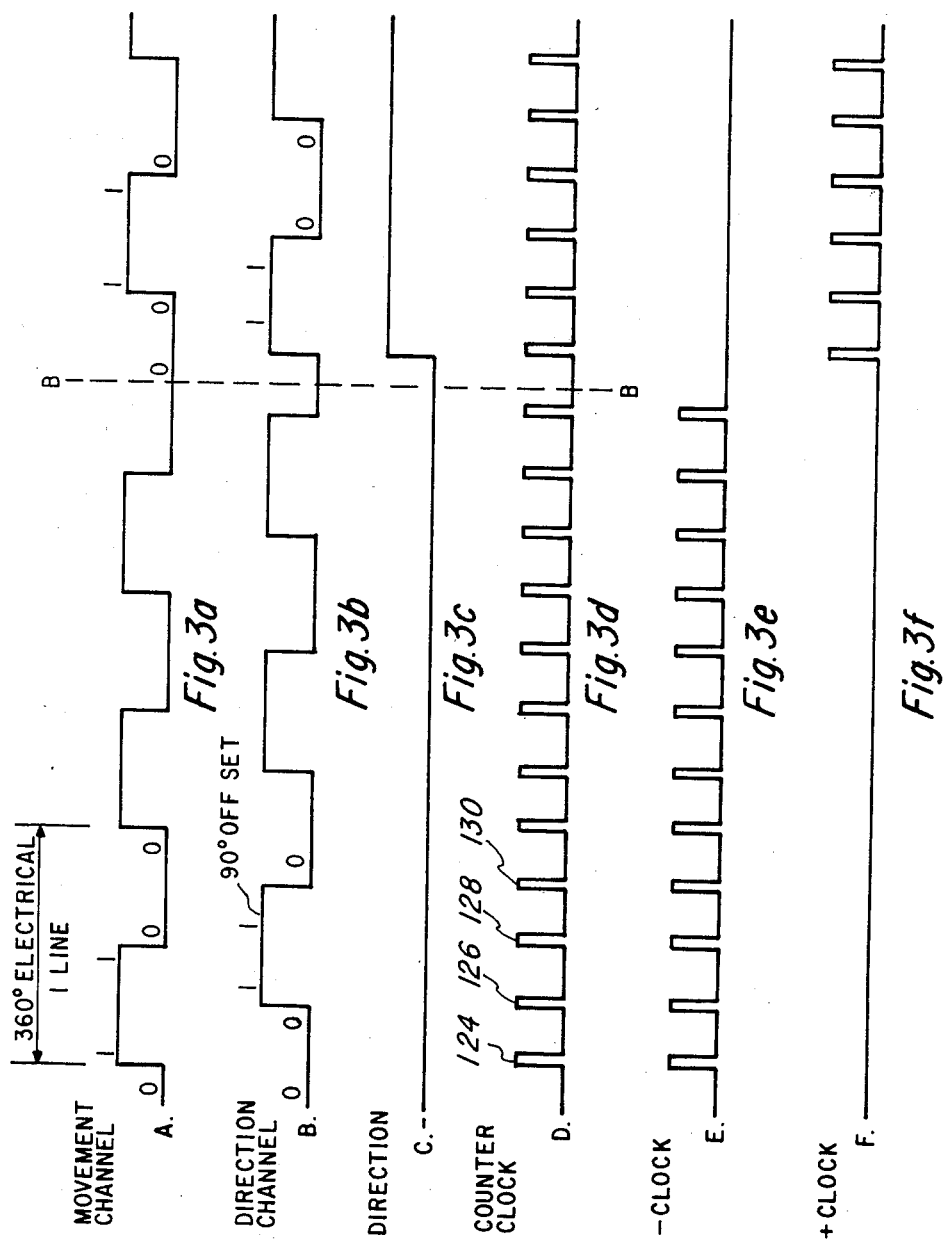

INCREMENTAL ENCODER SYNCHRONOUS DECODE CIRCUIT

This invention relates to decoders and more particularly to an incremental encoder synchronous decode circuit.

In the past, incremental encoder synchronous decoders utilize circuitry which is speed and noise limited. For example, the prior art decode circuits use one-shot multivibrators which are fired by the transitions of the raw encoder signals. This provides a pulse of known duration which is gated appropriately to provide direction of movement and clock signals. However, the signals from the encoder are originally analog, similar to sine and cosine signals. These signals are quantized to provide logic level signals. If, during quantization, noise occurs at the zero crossings, multiple transitions on the logic signals occur and the one-shot multivibrator operates in error.

In an effort to correct the one-shot multivibrator operation, hysteresis has been introduced in the quantization logic, but the possibility remains that a sufficiently large noise spike could occur to overcome the hysteresis. Further, it has been found that noise has occurred after quantization of the analog signals. Thus, additional logic circuits have been used to detect multiple firings of the one-shot multivibrator and to gate out unwanted pulses.

The speed problem is two-fold. The first problem attends the use of hysteresis because as speed increases the analog signals decrease in amplitude. Thus, when the analog amplitude reaches the set hysteresis level, the analog signals are lost entirely. The second problem is the multivibrator's pulsewidth. The pulsewidth must be small enough to prevent overlap. As the operating speed increases the allowable time for generating a clock and returning to a rest state for the next clock decreases.

Accordingly, it is an object of this invention to provide an incremental encoder synchronous decode circuit which has substantially improved noise and time restraints.

Another object of this invention is to provide an incremental encoder synchronous decode circuit which is compact, inexpensive, and lends itself to mass-production techniques.

A further object of the invention is to provide an incremental encoder synchronous decode circuit which obviates the requirement for one-shot multivibrators and discrete timing devices.

Briefly stated, the incremental encoder synchronous decode circuit constituting the first embodiment of the invention positions the counter clock well within the limits of a direction signal. Thus, the synchronous decode circuit can be located remotely from the computers because the timing margin is sufficient to overcome variations in cabling delays.

In a second embodiment the synchronous decode circuit provides flexibility in both direction and scale which can be used by the interface circuitry. In this embodiment the synchronous decode circuit is located on the same board as the counter and driven by a clock that is common to the synchronous decode circuit and the microprocessor that reads the counter for system control, preferably all or most of these items will be fabricated on a single semiconductor chip as an integrated chip.

These embodiments and other features, objects and advantages of the present invention will be apparent to persons skilled in the art from the following detailed descriptions of a preferred embodiment when read in conjunction with the following drawings in which.

Figure 6A:
Figure 6B:
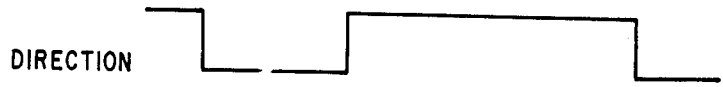
Figure 6C:
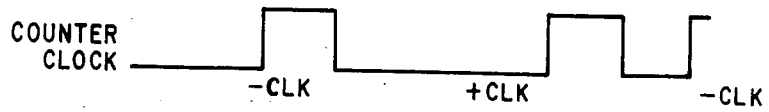
Figure 5A:
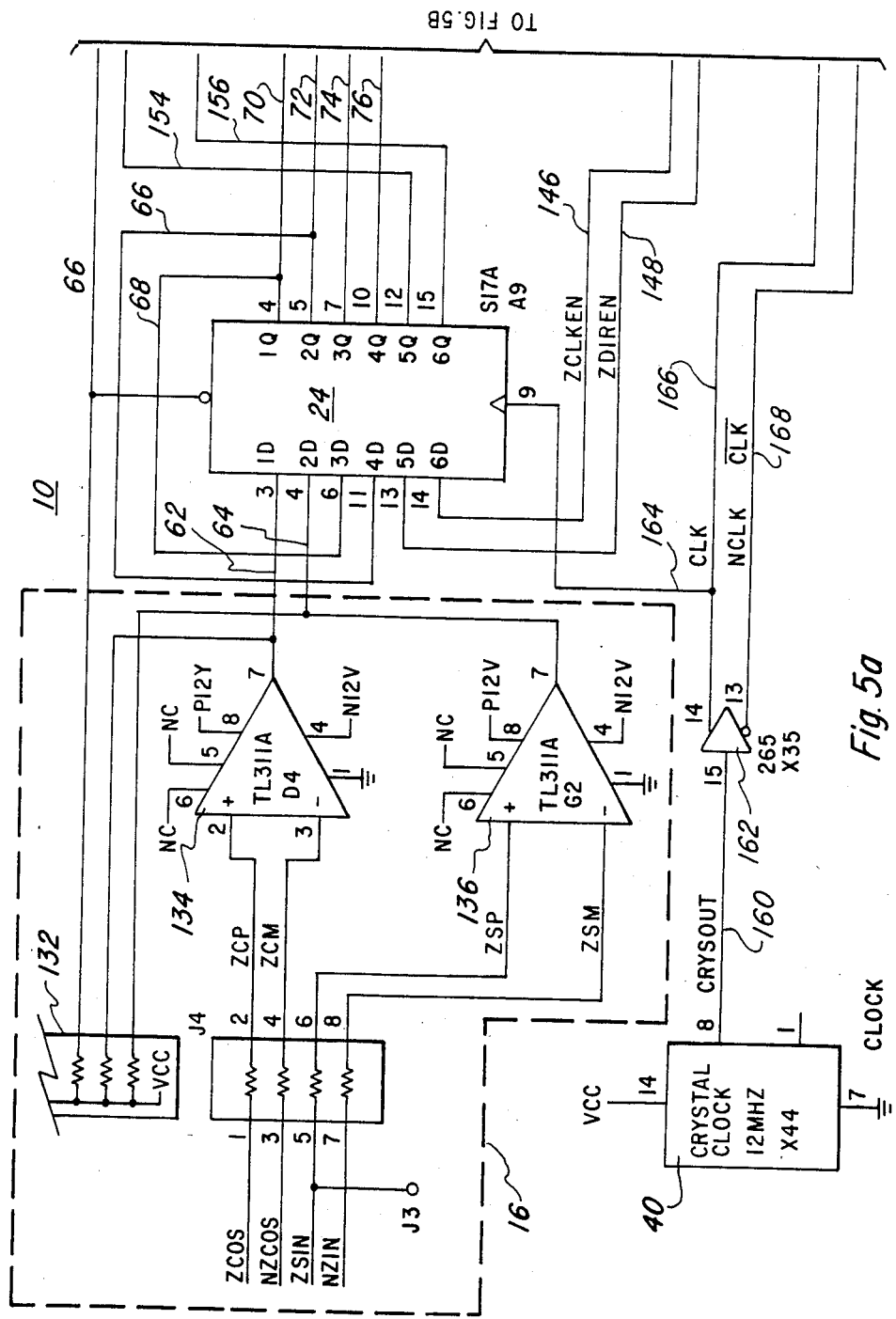
Figure 5B:
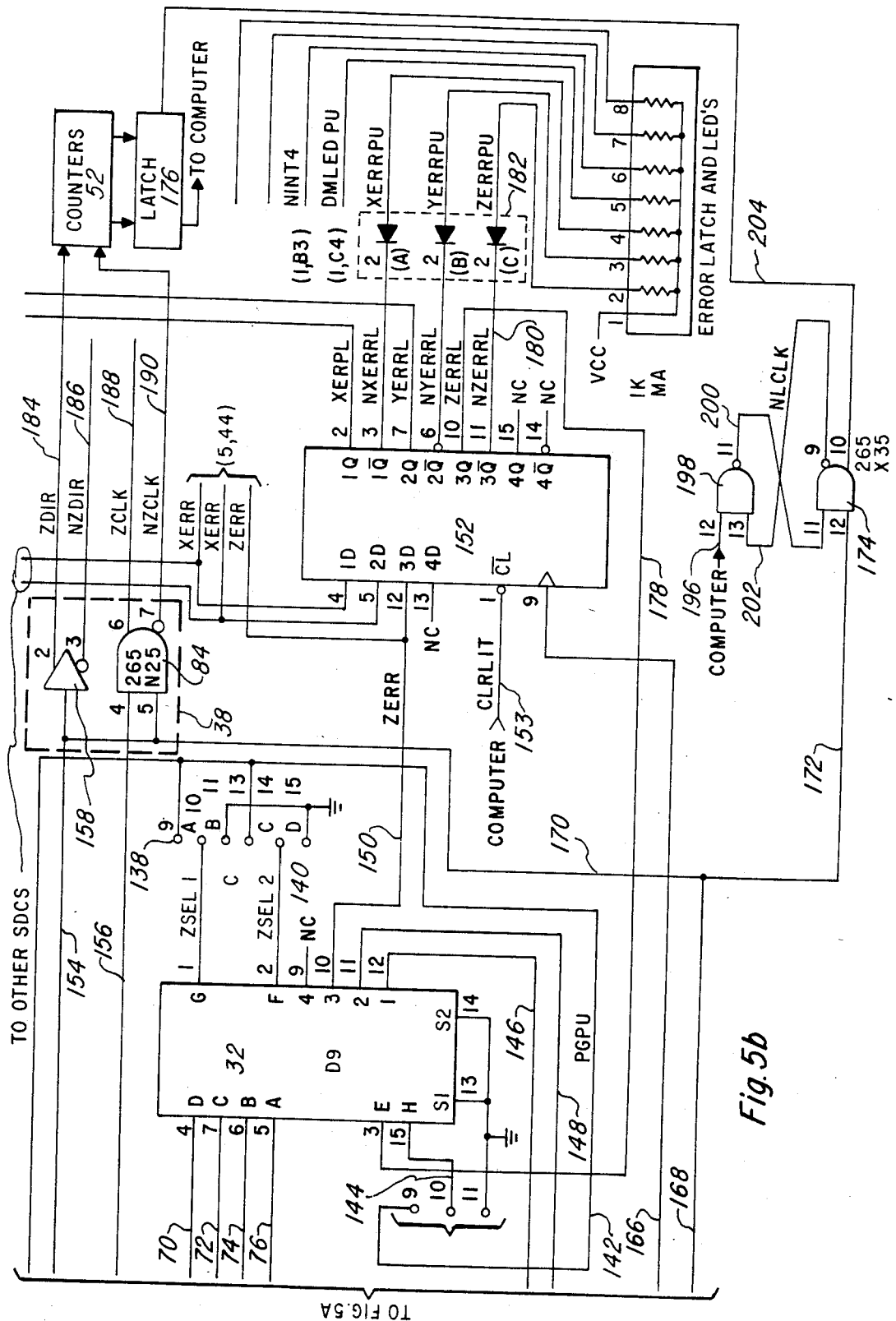

FIGS. 3a-3f constitute a signal diagram of encoder signals and required decode signals of the synchronous decode circuit without error detector or scaling;

FIGS. 4a-4e constitute a timing diagram of the output signals versus the synchronized clock pulses for the synchronous decode circuit without error detect or scaling;

FIGS. 5a and 5b constitute a circuit diagram of the second embodiment of the synchronous decode circuit with error detect and scaling;

FIGS. 6a-6c constitutes a timing diagram for the synchronous decode circuit of the second embodiment.

Referring to the drawings, the synchronous decoder circuit 10 constituting the subject matter of the first embodiment of the invention is connected by bus 12 to an incremental encoder 14 operatively connected to a servomotor of a servosystem (not shown). The servosystem is for positioning an object such as, for example, a step repeat camera or a component in an assembly line for assembly into the whole. The servosystem may be a three dimensional system for moving an object in the x,y, and z direction; in which case three servos are used with three incremental encoders and three synchronous decode circuits.

Figure 1:
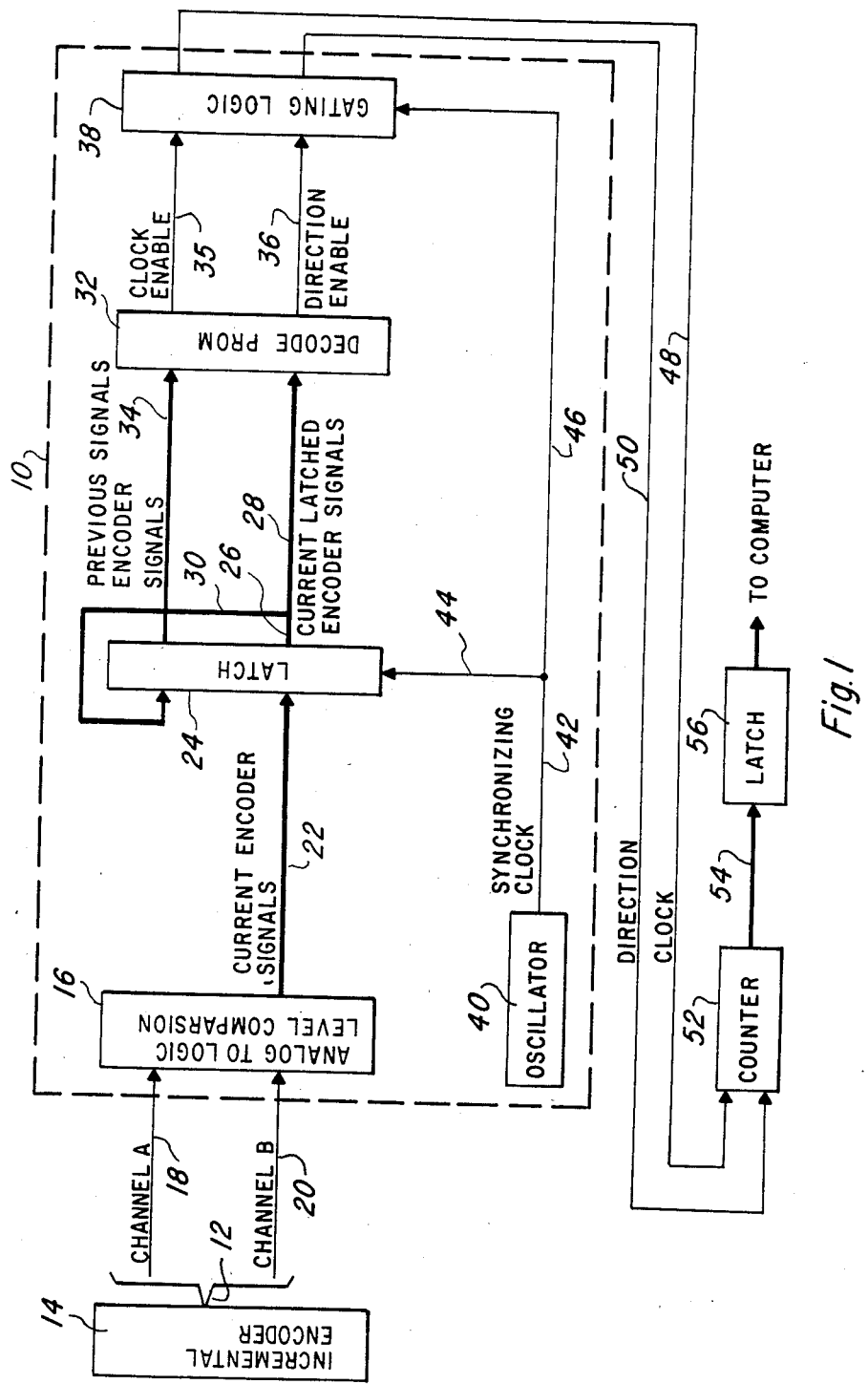
FIG. 1 is a block diagram of the incremental encoder synchronous decode circuit.

As the synchronous decode circuits are identical for description purposes only one need be described. The synchronous decoder circuit 10 (FIG. 1) comprises an analog-to-digital (logic level) converter 16 having a channel 18 and channel 20 connected to the incremental encoder 14. The A-to-D converter 16 is an input signal conditioner connected by bus 22 to a latch 24.

Latch 24 is a signal synchronizing latch having the latest (current) encoder signals connected by bus 26 to the junction of bus 28 and 30. Bus 28 connects the current encoder signals to a programmable decode read only memory (PROM) 32; while bus 30 feeds back the current encoder signals to latch 24 where they are delayed to become previous latched encoder signals. Bus 34 is connected to the latch 24 and PROM 32 for transporting the previous latched encoder signals to the PROM 32.

PROM 32 decodes the current and previous encoded signals for determining direction. The PROM is connected by leads 35 and 36 to gate logic circuits 38. Leads 35 and 36 provide, respectively, clock enable signals and direction enable signals to the gating logic circuits 38. A suitable clock generator 40 such as, for example, a voltage controlled oscillator is connected by lead 42 to the junction of leads 44 and 46 which are connected, respectively, to latch 24 and gating logic 38.

The gating logic circuit 38 completes the synchronous decode circuit of the first embodiment as the first embodiment is for updating existing circuits utilizing one-shot multivibrators which may be a considerable distance from the counters. As will be disclosed hereinafter a time window is sufficient in size to prevent overlap of the direction signals to the counters.

The gating logic 38 is connected by leads 48 and 50 to counters 52. Counters 52 are connected by bus 54 to a latch 56. Latch 56 is controlled by the computer to determine the count. The latch 56 is connected to the servocontroller (not shown).

Figure 2:
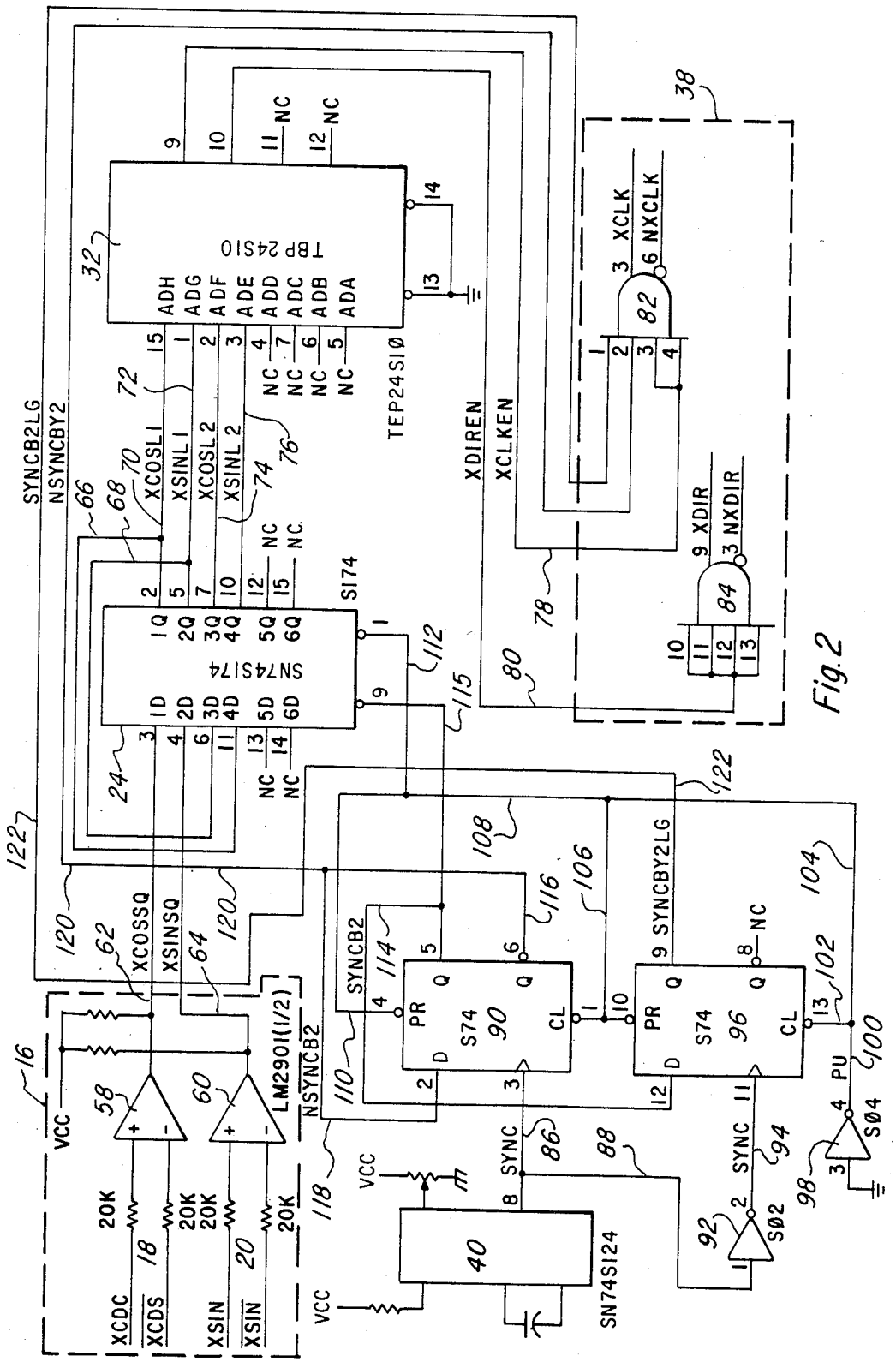
FIG. 2 is a circuit diagram of a first embodiment of the synchronous decode circuit.

Referring now to FIG. 2, the A-to-D converter 16 is a Texas Instruments Incorporated LM2901(½) which includes a comparator 58 for channel 18 and a comparator 60 for channel 20. Comparator 58 compares a quadrature phase (cosine) signal with a quadrature phase (cosine bar) reference signal and produces a logic "0" or "1"; while comparator 60 compares an in phase (sine) signal to an in phase (sine bar) reference signal and produces a logic "0" or "1". The comparators 58 and 60 are connected by leads 62 and 64, respectively, to pins 3 and 4 of latch 24.

Latch 24 is, for example, a Texas Instruments Incorporated SN 74S174, which is a Hex D - type latch of which two/thirds is required. Latch 24 has output pins 2 and 5 connected, respectively, to the junctions of leads 66 and 68, and 70 and 72. Leads 66 and 68 are connected, respectively, back to input pins 6 and 11 to feed back into latch 24 the current quadrature and in phase signals. While leads 70 and 72 are connected to pins 15 and 1 of decode PROM 32 for connecting thereto the current quadrature and in phase signals. Output pins 7 and 10 of latch 24 are connected by leads 74 and 76 to pins 2 and 3 of PROM 32.

PROM 32 is, for example, a Texas Instruments Incorporated TBP 24S10. PROM 32 determines from the current and previous quadrature and in phase signals the direction say, for example, the arm of a robot is moving and clock enable signals. Pins 9 and 10 of PROM 32 are connected by leads 78 and 80 to gating logic 38.

Gating logic 38 comprises a pair of differential AND gates 82 and 84. Differential AND gates 82 and 84 are SN 75183 gates manufactured by Texas Instruments Incorporated. Differential AND gates 82 and 84 have pins 3 and 4, and pins 10, 11, 12, and 13, connected, respectively, to leads 78 and 80 for receiving, respectively, the PROM's clock enable signals, and direction signals.

The clock 40 is, for example, an SN74S124 manufactured by Texas Instruments Incorporated. The clock operates at four MHz which is suitable where the synchronous decode circuit is positioned remotely to the counter. The oscillator frequency selected is that which will permit all circuitry within and driven by the synchronous decode circuit to respond and the time between clock edges is considerably shorter than the minimum time expected between natural encoder transitions. This allows all natural transitions to be properly latched for decoding. As no hysteresis is involved in the analog-to-TTL circuitry the natural roll-off of the encoder as speed increases is not a factor to be reckoned with.

The voltage controlled oscillator 40 is connected to the junction of leads 86 and 88. Leads 86 and 88 are connected, respectively, to pin 3 of flip-flop 90 and to invertor 92. Invertor 92 is connected by lead 94 to pin 11 of flip-flop 96. Thus, the VCO 40 provides non-inverted and inverted synchronization pulses, respectively, to flip-flops 90 and 96. The flip-flops are SN74S74s.

Flip-flops 90 and 96 have their clear pins 1 and 13 and preset pins 4 and 10, and latch 24 has its clear pin 1 connected to the output terminal of an invertor 98 whose input is connected to ground. The output is TTL high when the input is to ground. The TTL high inputs are connected by lead 100 to the junction of leads 102 to the clear pin 13 of flip-flop 96 and 104 to the junction of leads 106 to the preset pin 10 of flip-flop 96 and clear pin 1 of flip-flop 90 and 108 to the junction of leads 110 to the preset pin 4 of flip-flop 90 and 112 to the clear pin 1 of latch 24.

The Q pin 5 of flip-flop 90 is connected to the junction of leads 114 to input pin 12 of flip-flop 96 and 115 to pin 9 of latch 24, and its Q bar pin 6 connected by lead 116 to the junction of leads 118 to input pin 2 of flip-flop 90 and 120 to pin 2 of differential AND gate 82. While the Q pin 9 of flip-flop 96 is connected by lead 122 to pin 1 of differential AND gate 82.

The four MHz output of oscillator 40 is divided by two in flip-flop 90 to provide an in phase clock to latch 24 and gated through flip-flop 96 to provide a quadrature signal to the differential AND gate 82.

Referring now to FIGS. 3a–3f for a description of the encoder signals and required decoded signals. In the case of an n line encoder, i.e. n lines per revolution for a rotary encoder or n lines per inch for a linear encoder, a complete cycle on either channel 18 or 20 represents one line and there are four transitions per encoder line for a gray code (FIG. 3a).

The synchronizing clock generates a plurality of counter clock (FIG. 3d) pulses at a frequency dependent on scale factor, encoder lines per revolution and servosystem operating speed. By scale factor, applicant means the number of counter clocks generated per encoder line. The in phase channel 18 (FIG. 3a) starts at a low (logic 0) and goes high (logic 1) at the first pulse 124 (FIG. 3d); while the quadrature channel 20 (FIG. 3b) starts low (logic 0) to provide a (0,0) gray code, and remains low to provide a (0,1) until the second pulse 126 (FIG. 3d) when it goes high to provide a (1,1). At the third pulse 128 the in phase channel 18 (FIG. 3a) goes low to provide a (1,0) and with the fourth pulse 130 the quadrature channel 20 (FIG. 3b) goes low to provide a (0,0) and complete one cycle (360 electrical degrees).

This code continues for as long as the original direction (minus) as indicated by a low (FIG. 3c) is maintained. However, at line B—B the servo switches direction with a resultant change in phase of the signals on channels 18 and 20 (FIGS. 3a and 3b). With the change in phase the gray code reverses to (0,0), (1,0), (1,1), (0,1) and the direction (FIG. 3c) goes high (plus).

The PROM is programmed with the gray code and compares a current reading with the preceding reading and determines the direction of movement. As described a single clock (FIG. 3d) is used, nevertheless, dual clocks—one for a first direction and another for a second direction (FIGS. 3e and 3f) can be used.

Figure 4A:
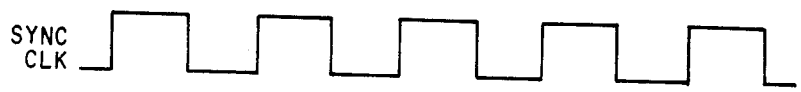
Figure 4B:
Figure 4C:
Figure 4D:
Figure 4E:

Referring now to FIGS. 4a–4e for the timing of the first embodiment. The synchronization clock pulses are shown in FIG. 4a, the divide by 2 in phase channel 18 pulses are shown in FIG. 4b, and the quadrature channel 20 pulses are shown in FIG. 4c. The directions of the servosystem are indicated in FIG. 4d and the counter 52 clock signals for determining the position of the servosystem are shown in FIG. 4e. The clocking period of the counters determines the resolution of the servosystem position.

The second embodiment of the synchronous decode circuit (FIGS. 5a and 5b) is substantially that of the first embodiment with the addition of an error detector and a measurement scale selector. The second embodiment is for use when the synchronous decode circuit 10 is close to the counter 52 (FIG. 5b) such as when, for example, it is included on the same board or chip as the counter and is driven by the same clock that drives the microprocessor and reads the counter for system control. This proximity is required because of the timing relationship between the counter clock and direction signals; the closer the relationship the faster the circuitry can operate.

The quadrature (cosine) signals and in phase (sine) signals from the servo encoder not shown are connected to the analog-to-digital converter 16 (FIG. 5a) which includes a pull up resistor pack 132 connected to analog-to-digital converters 134 and 136 (TL311A) for converting the quadrature and in phase analog signals to digital signals which are TTL compatible. The A-to-D converters 134 and 136 are connected to the latch 24 (SN74S174) where the current quadrature and in phase digital signals are fed back into the latch 24 to become preceding signals with the next current signals.

Latch 24 is connected to the PROM 32 (FIG. 5b) (TBP 24S10). PROM 32 has G and F pins 1 and 2 connected to jumpers 138 and 140. By selective jumping the scale factor can be quickly changed amongst 1, 2 and 4 counter clocks per encoder line. The jumpers 138 and 140 are connected to lead 142 to a direction select jumper 144. Jumper 144 has terminals connected to the H pin 15 and to the S1 and S2 pins 13 and 14 of PROM 32.

The 2, 1 pins 11 and 12 of PROM 32 are connected by leads 146 and 148, respectively, to pins 14 and 13 of latch 24 (FIG. 5a) to provide clock enable and direction enable signals to latch 24, and pin 10 of PROM 32 is connected by lead 150 to pin 12 of latch 152 to provide error signals to the latch.

Returning to latch 24 the Q5 and Q6 pins 12 and 15 are connected by leads 154 and 156, respectively, to the input of a differential buffer 158 (FIG. 5b) and pin 4 of a differential AND gate 84 of gating logic 38. Lead 154 connects a direction enable signal to the differential buffer 158 and lead 156 provides clock enable signals to pin 4 of a differential AND gate 84.

The oscillator 40 (FIG. 5a) is a 12 MHz clock generator connected by lead 160 to differential buffer 162. Differential buffer 162 has output pin 14 connected to the junction of leads 164 and 166. Leads 164 and 166 are connected, respectively, to the clock terminal pins 9 of latches 24 and 152 (FIG. 5b), and provide non-inverted pulses thereto. While pin 13 of the differential buffer 162 (FIG. 5a) is connected by lead 168 to the junction of leads 170 and 172 (FIG. 5b) connected, respectively, to pin 5 of the differential AND gate 84 of the gating logic 38, and pin 12 of a differential AND gate 174 of a counter latch 176 to provide inverted clock pulses thereto.

The error latch 152 (SN 74LS175) has input terminals connected to the remaining synchronous encoder circuits to receive error signals therefrom. The PROM when it detects an error in the code, that is, when a preceding pair is (0,0) and the new pair (1,1), or the preceding pair is (1,1,) and the new pair (0,0), or the preceding pair is (0,1) and the new pair (1,0), or the preceding pair is (1,0) and the new pair is (0,1), pin 12 of latch 152 and the system computer (not shown) receive an error signal. Latch 152 has its 3Q pin 10 connected by lead 178 to input pin 3 of PROM 32. Lead 178 provides an error signal to PROM 32. While latch 152 has its 3Q bar pin 11 connected by lead 180 to a light emitting diode 182.

Thus, the error detect circuitry is initiated from the PROM. When an invalid state change (non-gray code) on the encoder outputs is detected by the PROM 32 one of the PROM outputs (pin 10) goes high and is latched into latch 152. Latch 152 feeds back into the PROM a latched output on the next synchronizing clock. This provides the debounced latching action required for accurate error detection. The latch 152 can then be read by the control logic or microprocessor and light an LED 182 to indicate an error has occurred. When the LED is recognized the system is reset to the reference position and the system reinitiated including the clearing of latch 152 by a computer pulse generated on lead 153 to pin 1 of latch 152.

The gating logic circuitry 38 has its differential buffer's pins 2 and 3 (158) connected by leads 184 and 186 and its differential AND gate's pins 6 and 7 (84) connected by leads 188 and 190 as follows. Lead 184 provides a non-inverted direction signal to counters 52, and lead 186 provides an inverted direction signal for off-the-board or chip use in the system. While lead 188 provides a non-inverted clock signal for off-the-board use, and lead 190 provides an inverted clock signal to counters 52. The counters 52 are SN74LS169s.

The counters 52 are connected to a latch 176 which is read by the systems computer (not shown). When the computer directs latching of the counters 52 a signal is applied to lead 196 to pin 12 of NAND gate 198, NAND gate 198 has its inverted output pin 11 connected by lead 200 to pin 11 of differential AND gate 174. Pin 9 of differential AND gate 174 is connected by lead 202 back to NAND gate 198 pin 13 to provide an inverted clock pulse thereto, and pin 10 of differential AND gate 174 is as previously stated connected by lead 204 to latch 176 to provide clock pulses to latch 176.

Referring now to FIGS. 6a-6c, the rising edge of each clock pulse (FIG. 6a) is used to synchronize the clock signals for the system. The channel 18 and 20 signals forming the direction pulses (FIG. 6b) are not shown. The counter clock pulses (FIG. 6c) samples the direction pulses (FIG. 6b) to determine whether the direction is negative or positive at the clock pulse to determine the position of the servosystem driven by the computer.

Although several embodiments of this invention have been described herein, it will be apparent to a person skilled in the art that various modifications to the details of construction shown and described may be made without departing from the scope of this invention.

What is claimed is:

1. In a positioning system including an n-line incremental encoder connected to a servomotor of an object positioning servosystem and generating one line per cycle having four transitions per encoder line for a gray code in response to movement of an object in a preselected dimension, a counter for timing the movement of the object in the preselected dimension and a counter latch for connection to a system computer for determining the count for distance measurement, a synchronous decoder circuit comprising:

(a) an analog-to-digital (AD logic level) converter having an in phase channel comparator and a quadrature channel comparator for connection to the incremental encoder for conditioning the signals thereof;

(b) a signal synchronizing latch operatively connected to the AD converter in phase and quadrature channel comparators for receiving the latest conditioned encoder signals, said latch having a feedback circuit for feeding back the latest conditioned encoder signals to the latch where they are delayed for providing previous latched encoder signals together with the latest conditioned encoder signals;

(c) a programmable decode read only memory (PROM) operatively connected to the synchronization latch for decoding the latest and previous encoded signals for determining direction, said PROM being programmed with a gray code;

(d) a gating logic circuit operatively connected to the PROM for receiving clock enable signals and direction enable signals; and (e) a clock generator operatively connected to the in phase and quadrature channel comparators, synchronization latch and gating logic circuit for clocking the synchronous decode circuit, said clock for generating a plurality of counter clock pulses at a preselected frequency determined by the number of counter clocks generated per encoder line (scale factor), encoder lines per revolution and servosystem operating speed;

whereby the in phase channel and quadrature channel signals, respectively, start low and high to provide a gray code for each cycle in a first direction and conversely for each cycle in a second direction for comparison with the gray code of the PROM for direction of movement determinations.

2. A synchronous decode circuit according to claim 1 further including a scale factor means operatively connected to the PROM for adjusting the measurement scale amongst 1,2, and 4 counter clocks per cycle.

3. A synchronous decode circuit according to claim 1 further including a code error detector means, said code error detector means having a latch operatively connected to the PROM for receiving a code error signal and for feeding back an error indicating signal to the PROM for the next output thereby providing a debouncing latching action for accurate error detection.

4. A synchronous decode circuit according to claim 2 wherein the scale factor means includes jumper circuits for selectively setting the measurement scale amongst preselected number of counter clocks per cycle.

* * * * *